(12) United States Patent
Kawamura et al.

(10) Patent No.: US 8,909,369 B2
(45) Date of Patent: Dec. 9, 2014

(54) TRANSPORT FACILITY

(75) Inventors: Shinsuke Kawamura, Ritto (JP);
Takahiro Horii, Kusatsu (JP)

(73) Assignee: Daifuku Co., Ltd., Osaka (JP)

( * ) Notice: Subject to any disclaimer, the term of this patent is extended or adjusted under 35 U.S.C. 154(b) by 390 days.

(21) Appl. No.: 13/326,899

(22) Filed: Dec. 15, 2011

(65) Prior Publication Data

US 2012/0152693 A1 Jun. 21, 2012

(30) Foreign Application Priority Data

Dec. 17, 2010 (JP) .................................. 2010-282187

(51) Int. Cl.
*G06F 7/00* (2006.01)
*H01L 21/67* (2006.01)
*H01L 21/677* (2006.01)

(52) U.S. Cl.
CPC ...... *H01L 21/67259* (2013.01); *H01L 21/6773* (2013.01)
USPC ........... 700/228; 700/213; 700/218; 198/358; 198/370.1; 414/217; 414/816

(58) Field of Classification Search
USPC ........................................................ 700/228
See application file for complete search history.

(56) References Cited

U.S. PATENT DOCUMENTS

| 2001/0010462 | A1* | 8/2001 | Kawanishi et al. | 324/158.1 |
| 2007/0214747 | A1* | 9/2007 | Horng et al. | 53/432 |
| 2007/0231110 | A1* | 10/2007 | Akiyama | 414/217 |
| 2008/0071417 | A1* | 3/2008 | Rice et al. | 700/213 |
| 2012/0067695 | A1* | 3/2012 | Kimata | 198/370.01 |

FOREIGN PATENT DOCUMENTS

| JP | 6156676 A | 6/1994 |
| JP | 2005347576 A | 12/2005 |
| JP | 200739182 A | 2/2007 |

* cited by examiner

*Primary Examiner* — Gene Crawford
*Assistant Examiner* — Kyle Logan
(74) *Attorney, Agent, or Firm* — The Webb Law Firm

(57) ABSTRACT

A transport device is configured to transport different kinds of articles which have different lengths from the held portion or a position corresponding to the held portion to one end portion along the fore and aft direction. There are provided an article detection device for detecting an article, end detection device for detecting the one end portion, along the fore and aft direction, of the article detected by the article detecting device, and a determination device for determining the kind of the article based on detected information from the article detecting device and detected information from the end detection device.

11 Claims, 5 Drawing Sheets

TRANSPORT FACILITY

BACKGROUND OF THE INVENTION

1. Field of the Invention

The present invention relates to a transport facility including a transport device configured to transport an article having a held portion to be held by holding means, along a transporting path with the article in a transporting attitude in which the held portion is located in a central part of the article in a fore and aft direction.

2. Description of the Related Art

Such transport facilities are used to transport articles along a transporting path by means of transport devices. By transporting an article in a transporting attitude in which the held portion (i.e., a portion to be held by a holding means) of the transported article is located in the central part in the fore and aft direction of the article, the articles can be held while maintaining a good balance in the fore and aft direction when holding the held portion of the transported article with the holding means. And, there is a conventional transport facility which transports FOUPs (Front Opening Unified Pod) as articles to be transported, each of which stores two or more substrates and is transported by a transport device within a factory with the fore and aft direction of each article oriented along the transporting direction. (See, for example, JP Publication of Application No. 06-156676.)

The transport facility described in this JP No. 06-156676 is used to transport FOUPs with a transport device; however, FOSBs (Front Opening Shipping Box) are sometimes transported by the transport device among the FOUPs. Although, like FOUPs, FOSBs are also used to store substrates, unlike the FOUPs, FOSBs are not standardized by a standard. And there are many FOSBs whose length (i.e. distance) from its held portion to one end potion along the fore and aft direction in its transporting attitude is longer than that of a FOUP. At times, only the FOSBs whose length (i.e. distance) from its held portion to one side end in the fore and aft direction in its transporting attitude is longer than that of a FOUP are used as the ones to be transported by the transport devices. And when transporting different kinds of articles whose lengths from the held portion to one end in the fore and aft direction in the transporting attitude differ from each other, such as when both FOUPs and FOSBs are transported by the transport devices, it is necessary to determine the kind of each of the different kinds of articles transported by the transport devices.

That is, the transport device described in JP No. 06-156676 detects the forward end portion of a FOUP transported to a stop preparation position with detection means, and stops the operation of the transport device to stop the FOUP at a stop position immediately after the forward end portion of FOUP is detected by the position detection means. When, on the other hand, this transport device transports a FOSB, the forward end portion of the FOSB would stop at the same position as the forward end portion of a FOUP if the operation of the transport device is stopped immediately after the forward end portion of the FOSB is detected by the position detection means. Thus, if a FOSB is stopped such that its forward end portion stops at the same position as the forward end portion of a FOUP, then the position of the held portion of the FOSB is displaced upstream in the transporting direction with respect to the position of the held portion of a FOUP by the difference in lengths from the held portion to one end portion along the fore and aft direction with respect to the transporting direction. Thus, there is a possibility that the held portion of the FOSB cannot be properly held by the holding means even when an attempt is made to hold the held portion of FOSB thus displaced by holding means.

To this end, when stopping a FOSB, it is conceivable to cause the held portion of the FOSB to stop at the same position as the held portion of a FOUP by stopping the operation of the transport device after a predetermined period has elapsed after the forward end portion is detected by the position detection means. However, to do so would require determining whether the article transported by the transport device is a FOUP or a FOSB before stopping the FOUP or the FOSB.

An example of a conventional device—for determining the kind of each of different kinds of articles whose lengths from the held portion to one end in the fore and aft direction in the transporting attitude differ from each other—includes one for which the articles to be transported include FOUPs that are transported with a lid attached and FOSBs that are transported without a lid and with which an article with a lid attached is determined to be a FOUP and an article without a lid is determined to be a FOSB based on the detected information from lid detection means. (See, for example, JP Publication of Application No. 2005-347576.)

This JP No. 2005-347576 describes a device for determining whether each of the different kinds of articles is a FOUP or a FOSB. And the device described in this reference distinguishes a FOUP (which has a lid attached) and a FOSB (which has no lid attached) from each other by detecting the presence of a lid by lid detection means. And if it's a FOUP, its lid is removed by a FOUP opener, and if it's a FOSB, the lid is not removed by the FOUP opener since it had already been removed manually in advance. However, a lid is typically attached when transporting either a FOUP or a FOSB by a transport device. Thus, in the case where a lid is attached to both the FOUPs and FOSBs, it is not possible to tell them apart with the device described in this reference.

Therefore, it is not possible to determine the kind of each of different kinds of articles with the device described in this reference when transporting different kinds of articles whose lengths from the held portion to one end in the fore and aft direction in the transporting attitude differ from each other.

It is conceivable to have a device—for determining the kind of each of different kinds of articles whose lengths from the held portion to one end in the fore and aft direction in the transporting attitude differ from each other—for which FOUPs (which have a flange portion that is located on the top surface and that is gripped when supported and suspended by a ceiling transport vehicle) and FOSBs (which have no such flange portion) are transported by a transport device, and with which an article with a flange portion is determined to be a FOUP and an article without a flange portion is determined to be a FOSB. However, there are also FOSBs that have a flange portion; therefore, it is not possible to distinguish the FOUPS from the FOSBs when transporting FOSBs having such a flange portion among FOUPs with the transport device.

SUMMARY OF THE INVENTION

The present invention was made in light of the present state of the art described above and its object is to provide a transport facility in which at least one of the shortcomings of the prior art is improved.

In a transport facility in accordance with the present invention which includes a transport device configured to transport an article having a held portion to be held by holding means, along a transporting path with the article in a transporting attitude in which the held portion is located in a central part of the article in a fore and aft direction, the transport device being configured to transport different kinds of articles having different lengths from the held portion to one end portion along the fore and aft direction with the article in the transporting attitude, the transport facility comprises:

article detection means for detecting an article located at a predetermined article position with the held portion being located at a held portion set position that is set in advance;

end detection means for detecting one end portion, along the fore and aft direction, of the article detected by the article detection means;

determining means for determining a kind of the article based on detected information from the article detection means and on detected information from the end detection means.

That is, because the predetermined article position is set with respect to the held portion located at the held portion set position, the held portion of the article located at the predetermined article position is located at the same held portion set position regardless of the kind of the article. And since the length or distance from the held portion to one end portion along the fore and aft direction is different depending on the kind of the article, the position of the one end portion, along the fore and aft direction, of the article located at the predetermined article position is different depending on the kind of the article. Therefore, by detecting the one end portion, along the fore and aft direction, of the article detected by the article detection means is detected by the end detection means when the article transported to the predetermined article position by the transport device is detected by the article detection means, the determining means can determine the kind of the article detected by the article detection means based on the detected information from the end detection means.

Therefore, the invention can provide a transport facility which is capable of determining the kind of different kinds of articles when transporting different kinds of articles having different lengths from the held portion to one end portion along the fore and aft direction with the articles in the transporting attitude.

Further, a transport facility having a transport device for transporting along a transporting path different kinds of articles each having a held portion to be held by a holding member, the transport facility comprises:

an article sensor that detects a first structure provided at a location that corresponds to a reference position set with respect to the held portion of an article;

an end sensor that detects one end portion, along a fore and aft direction, of the article whose first structure is detected by the article sensor;

a controller that determines a kind of the article by obtaining a distance between the one end portion and a specific position set with respect to the held portion based on detected information from the article sensor and detected information from the end sensor.

DESCRIPTION OF THE PREFERRED EMBODIMENTS

The preferred embodiment of the present invention is described next with reference to the drawings.

Figure 1:
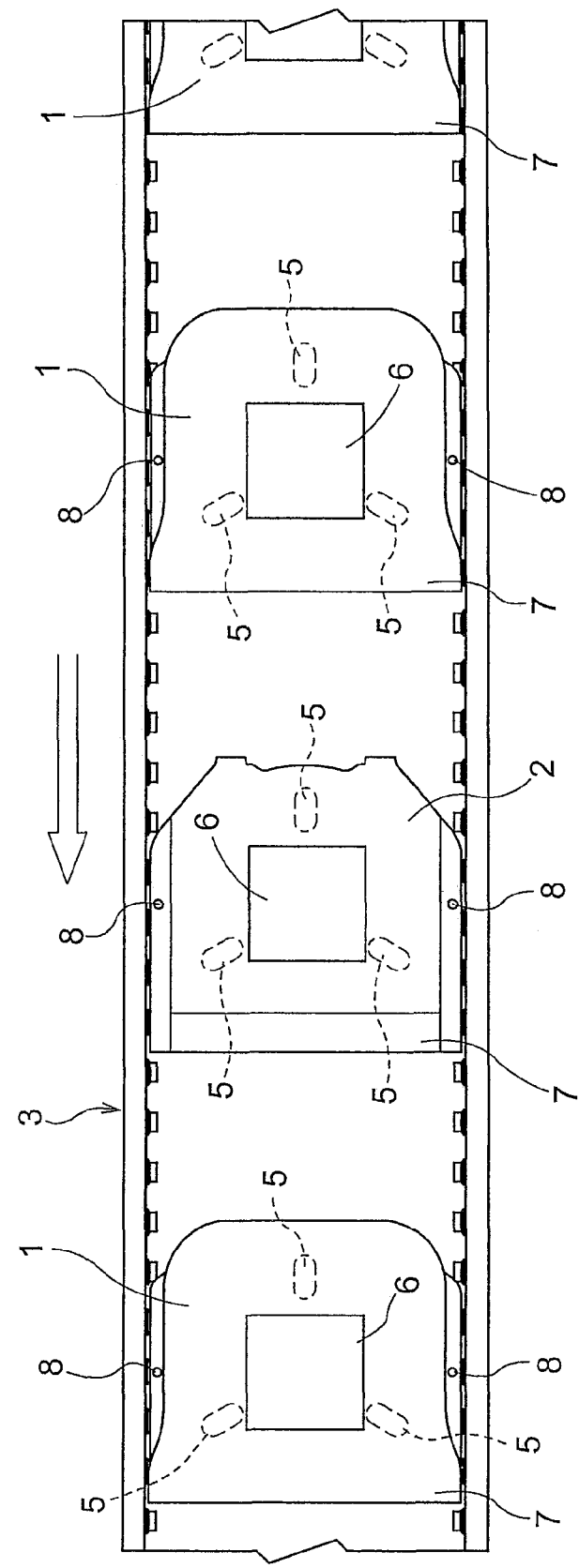
FIG. 1 is a plan view of an article transport device.

As shown in FIG. 1, the article transport facility includes a transporting conveyor (which corresponds to a transport device) 3 for transporting different (i.e. two or more) kinds of articles which consist of FOUPs 1 (which correspond to the first articles) for intra-factory transportation, each of which is used to store two or more substrates such as semiconductor wafers and to transport them within a factory, and FOSBs 2 (which correspond to the second articles) for inter-factory transportation, each of which is used to store two or more substrates such as semiconductor wafers and to transport them between factories. In the present specification, the front direction is defined to be the transporting direction of this transporting conveyor 3. The fore and aft direction is direction is defined to be the direction along the transporting direction. And the lateral direction is defined to be the horizontal direction that intersects perpendicularly with the transporting direction.

Figure 2A:
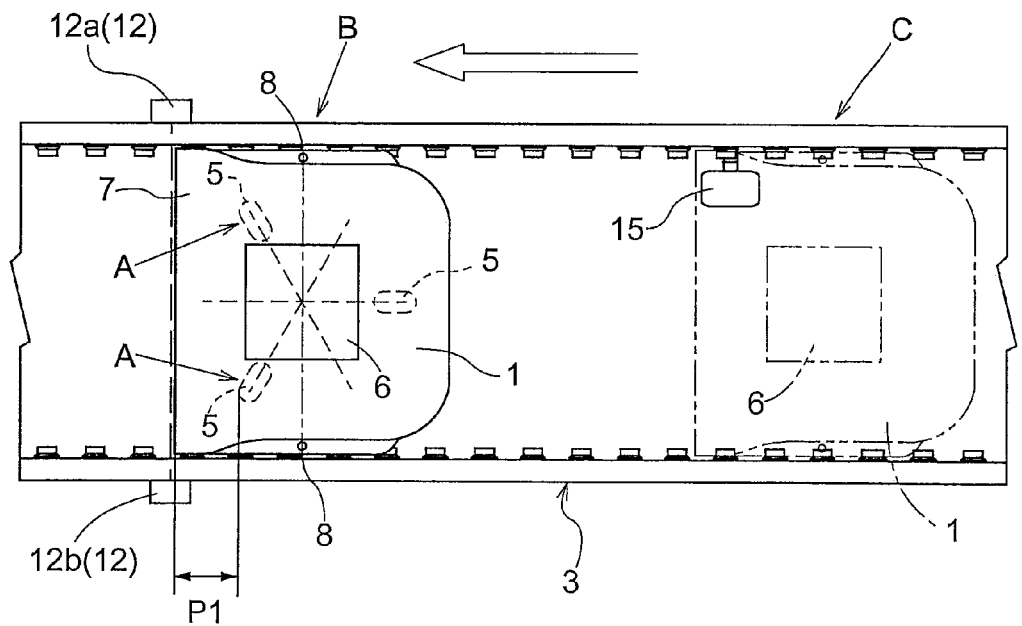
FIG. 2A is the plan view showing an article at a predetermined article position, and at a deceleration position.
Figure 2B:
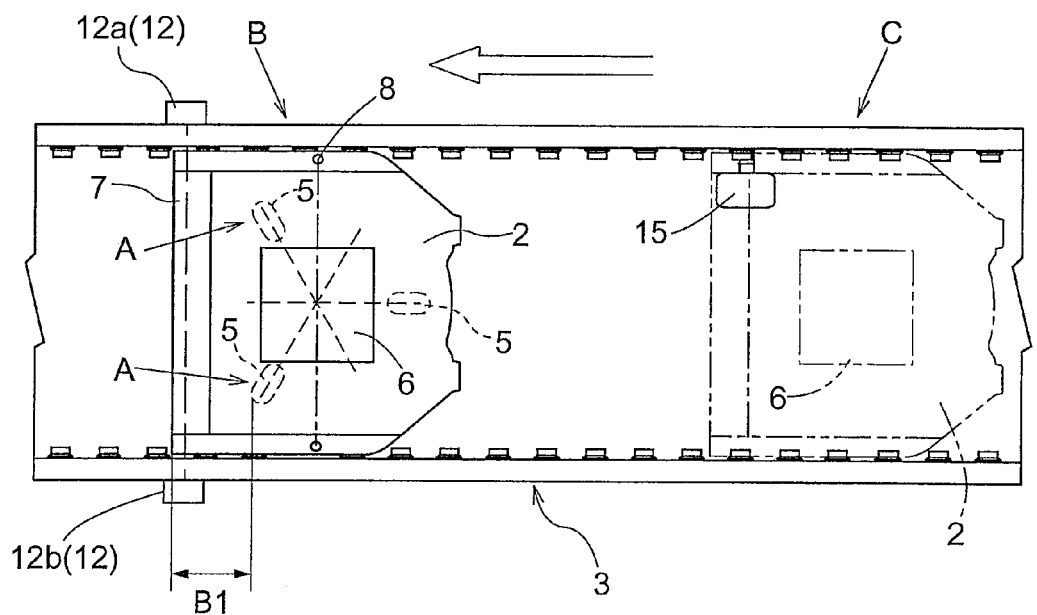
FIG. 2B is the plan view showing an article at a predetermined article position, and at a deceleration position.

Provided to an undersurface of each of the FOUPs 1 and the FOSBs 2 are positioning portions 5 (corresponding to the held portion) which engage engaging pins 4a provided to a fork mechanism 4 (which corresponds to holding means (see FIG. 4)) when received and supported by the fork mechanism 4, for positioning the article 1 or 2 in a predetermined position on the fork mechanism 4. As shown in FIG. 2, each of the positioning portions 5 is a recessed portion that extends along respective longitudinal axis (shown by the dashed lines). Three positioning portions 5 are provided in the undersurface of the FOUPs 1 and FOSBs 2. Of the three positioning portions 5, each of the two positioning portions 5 provided at locations close to the forward end portion 7 of an article 1 or 2 has a longitudinal axis that is inclined in the lateral and forward directions in plan view. And one positioning portion 5 arranged rearwardly from these positioning portions 5 has a longitudinal axis that extends in the fore and aft direction. The longitudinal axes of the three positioning portions 5 intersect at one point. As described below, this intersection point becomes a reference position when determining the position of an article 1 or 2. And, provided to an upper surface of each of the FOUPs 1 and the FOSBs 2 is a flange portion 6 that is gripped when the article is suspended and supported by a ceiling transport vehicle, etc. And, although illustration is omitted, an access opening for taking the substrates in and out of the article is formed at the forward end portion 7 of each of the FOUPs 1 and FOSBs 2 and a lid that can close and open the access opening is attached to the forward end portion 7.

And formed in each of FOUPs 1 and FOSBs 2 are through holes 8 that extend in the vertical direction at locations that correspond to the positioning portions 5 for indicating the center (the above-mentioned intersection point) of the plurality of positioning portions 5. The through holes 8 are formed such that the positional relationship of the position of each through hole 8 in a FOUP 1 with respect to its positioning portions 5 in plan view is identical to the positional relationship of the position of the corresponding through hole 8 in a FOSB 2 with respect to the FOSB's positioning portions 5 in plan view. More specifically, as shown in FIG. 2, the through holes 8 are located, in plan view, on a horizontal line that passes through the point (the reference position) that the longitudinal axes of the three positioning portions 5 intersect and that extends in the direction (lateral direction) that is perpendicular to the direction along the transporting path, and in either end area in the lateral direction of the FOUP 1 and FOSB 2. Accordingly, in the present embodiment, the through holes 8 are located at the same position as the reference position (which is used to determine the position of the articles 1 and 2) in the fore and aft direction in plan view. However, the through holes 8 may be provided at positions that are separated from the reference position in the fore and aft direction by a set distance (which is identical for all the different kinds of articles). Therefore, when the positioning portions 5 of a FOUP 1 and the corresponding positioning portions 5 of a FOSB 2 are located at the same locations in the direction along the transporting path and in the direction that intersects perpendicularly with the transporting path, then the through holes 8 of the FOUP 1 and the corresponding through holes 8 of the FOSB 2 are arranged to be at the same corresponding locations in the direction along the transporting path and in the direction that intersects perpendicularly with the transporting path.

And as shown in FIG. 2, the positioning portions 5 are provided to each of the FOSBs 2 at such positions that the length (or distance) B1 from the forward end portion 7 of the FOSB 2 to the positioning portions 5 is greater than the length P1 from the forward end portion 7 of the FOUPs 1 to their positioning portions 5. That is, the length (or distance) from the forward end portion 7 to the positioning portions 5 is different between the FOUPs 1 and the FOSBs 2; thus, the FOUPs 1 and the FOSBs 2 are considered to be different kinds of articles. In the present embodiment, as shown in FIG. 2, the length from the forward end portion 7 to the positioning portions 5 may be defined as the distance from the forward end portion 7 to the forward end portions of the two positioning portions 5 provided closer to the front. The definition is not limited to this and the distance may be defined as the distance in the fore and aft direction from the forward end portion 7 to a specific position set with respect to the reference position in the articles 1 and 2 (therefore, set with respect to the positioning portions 5 which form the held portion). This specific position may also be the front end portions of the two positioning portions 5 provided closer to the front, or may also be the reference position.

As shown in FIGS. 1-4, the transporting conveyor 3 is configured to transport each of the different kinds of articles 1 and 2 (having the positioning portions 5 to be held by a fork mechanism 4 described above or by some other device) in an transporting attitude in which the forward end portion 7 faces upstream with respect to the transporting direction (that is, an attitude in which the access opening faces upstream in the transporting direction) and in which the positioning portions 5 are located in the central part or portion of the article 1 or 2 in the fore and aft direction. Incidentally, in FIGS. 1-3, the direction shown by the arrow is the transporting direction, and the articles 1 and 2 are transported from the upstream side to the downstream side in the transporting direction along the direction indicted by the arrow.

Provided to the article transport facility are an article detection means 11 for detecting that the article 1 or 2 whose positioning portions 5 are located at the held portion set position A which is arranged at an intermediate position in the transporting path in advance is located at a predetermined article position B; an end detection means 12 for performing a detecting function on the article 1 or 2 detected by the article detection means 11 as the article 1 or 2 is detected by the article detection means 11, and for detecting the position of the forward end portion 7 of the article 1 or 2; and a control device H including determining means 13 for determining the kind of article 1 or 2 based on the detected information from the article detection means 11 and on the detected information from the end detection means 12 so as to determine the kind of article 1 or 2 based on the position of the forward end portion 7 of the article 1 or 2 located at the predetermined article position B. Here, the held portion set position A is the position of the positioning portions 5 (two positioning portions 5 provided closer to the front in present embodiment) of an article 1 or 2 when the article 1 or 2 is located at the predetermined article position B. Incidentally, the articles 1 and 2 located at the predetermined article position B are shown with solid lines in FIGS. 2 and 3, and the articles 1 and 2 located at the deceleration position C described later are shown with phantom lines.

Figure 3A:
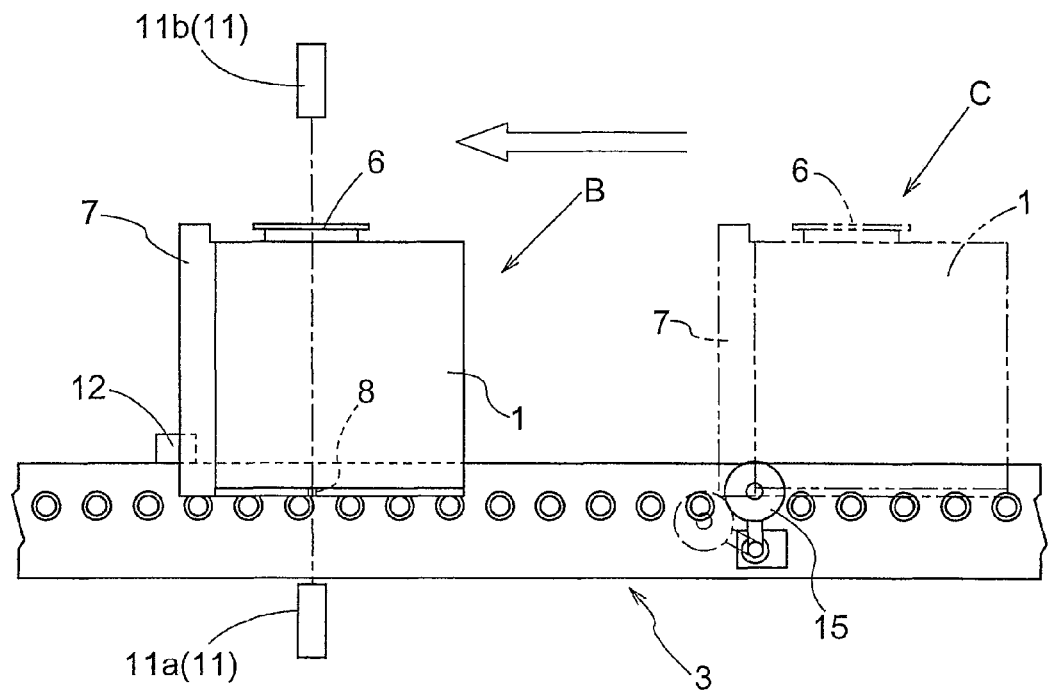
FIG. 3A is a side view showing the article at the predetermined article position and the deceleration position.
Figure 3B:
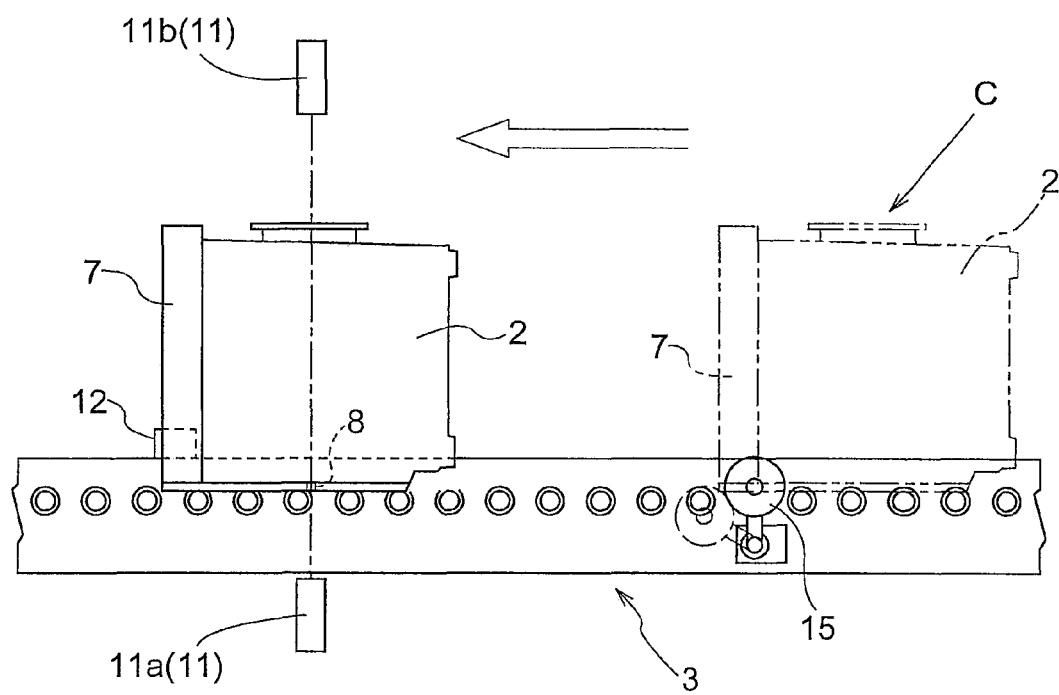
FIG. 3B is a side view showing the article at the predetermined article position and the deceleration position.

The forward end portion 7 of a FOSB 2 when the FOSB 2 is located at the predetermined article position B is located downstream in the transporting direction with respect to the location of the forward end portion 7 of a FOUP 1 when the FOUP 1 is located at the predetermined article position B. As shown in FIGS. 2 and 3, therefore, the end detection means 12 is configured to detect whether the forward end portion 7 of the article 1 or 2 located at the predetermined article position B exists or is located downstream in the transporting with respect to the forward end portion 7 of the FOUP 1 located at the predetermined article position B. More specifically, the end detection means 12 includes an end detection light emitter 12*a* which emits detection light in a horizontal direction that is perpendicular to the transporting direction, and an end detection light receiver 12*b* which receives the detection light emitted from the light emitter 12*a* for end detection. And as shown in FIG. 2, the end detection means 12 is so located that the detection light passes at a location downstream in the transporting direction with respect to the front end of a FOUP 1 when the FOUP 1 is located at the predetermined article position B and that the detection light passes at a location upstream in the transporting direction with respect to the front end of a FOSB 2 when the FOSB 2 is located at the predetermined article position B. And depending on whether the end detection light receiver 12*b* receives the detection light emitted by the end detection light emitter 12*a*, the end detection means 12 is configured to detect two different positions or locations of the forward end portion 7, namely, one in which the forward end portion 7 of the article 1 or 2 is located at a position that is upstream in the transporting direction than the location at which the detection light passes so as not to block the detection light, or one in which the forward end portion 7 of the article 1 or 2 is located at the position at which the detection light passes so as to block the detection light. The various control means, control devices, or other members which have control functions described in the present specification have a CPU, memory, a communication unit, etc., and algorithms which execute the functions described in the specification are stored in memory. The determining means 13 in the present embodiment is implemented by a part of the algorithms (or a computer program) of this control device H.

As shown in FIG. 3, the article detection means 11 includes an article detection light emitter 11*a* (which corresponds to the light emitter) which emits detection light vertically upwardly, and an article detection light receiver 11*b* (which corresponds to the light receiver) which receives the detection light emitted from the article detection light emitter 11*a*. And the article detection means 11 is positioned such that the detection light passes through the through hole 8 in the vertical direction when the article 1 or 2 is located at the predetermined article position B. And the article detection means 11 is configured to detect an article 1 or 2 located at the predetermined article position B by the virtue of the fact that the detection light emitted by the article detection light emitter 11a is received by the article detection light receiver 11b through the through hole 8.

To determine the kind of the article 1 or 2 based on the position of the forward end portion 7 of the article 1 or 2 located at the predetermined article position B, the determining means 13 is configured to determine that the article is a FOUP 1 if the forward end portion 7 of the article 1 or 2 located at the predetermined article position B is not detected by the end detection means 12, and that the article is a FOSB 2 when the forward end portion 7 of the article 1 or 2 located at the predetermined article position B is detected by the end detection means 12 based on the detected information from the article detection means 11 and the detected information from the end detection means 12.

More specifically, the determining means 13 determines that the article is a FOUP 1 if the end detection light receiver 12b is receiving the detection light emitted light by the end detection light emitter 12a because the forward end portion 7 of the article 1 or 2 is located upstream in the transporting direction with respect to the location at which the detection light passes, when the article detection light receiver 11b is receiving the detection light emitted light by the article detection light emitter 11a because the article 1 or 2 is located at the predetermined article position B. In addition, the determining means 13 determines that the article is a FOSB 2 if the end detection light receiver 12b does not receive the detection light emitted light by the end detection light emitter 12a because the forward end portion 7 of the article 1 or 2 is located at the position at which the detection light passes, when the article detection light receiver 11b is receiving the detection light emitted light by the article detection light emitter 11a because the article 1 or 2 is located at the predetermined article position B.

Figure 4A:
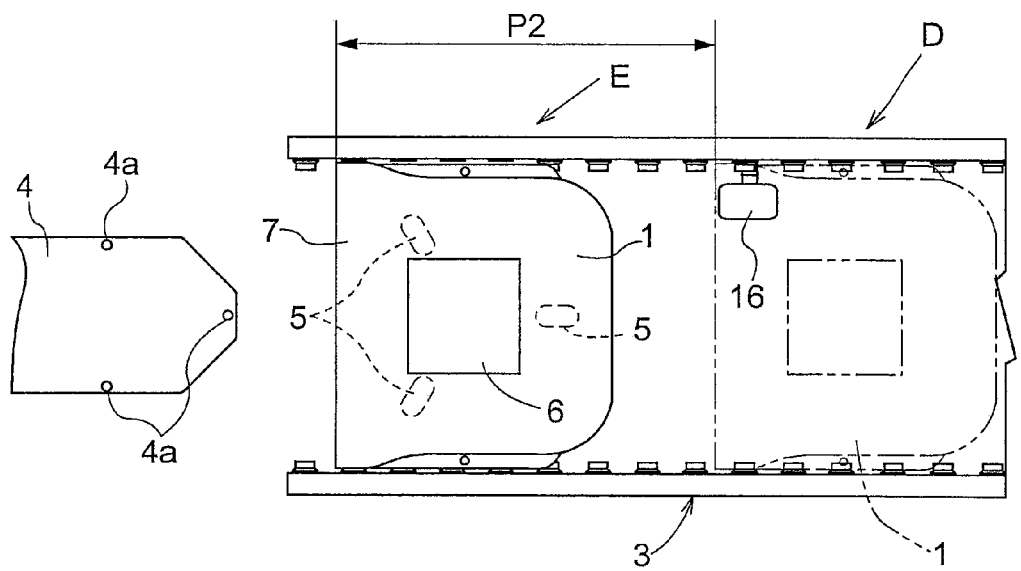
FIG. 4A is a plan view showing an article at a stop preparation position and a stop position.
Figure 4B:
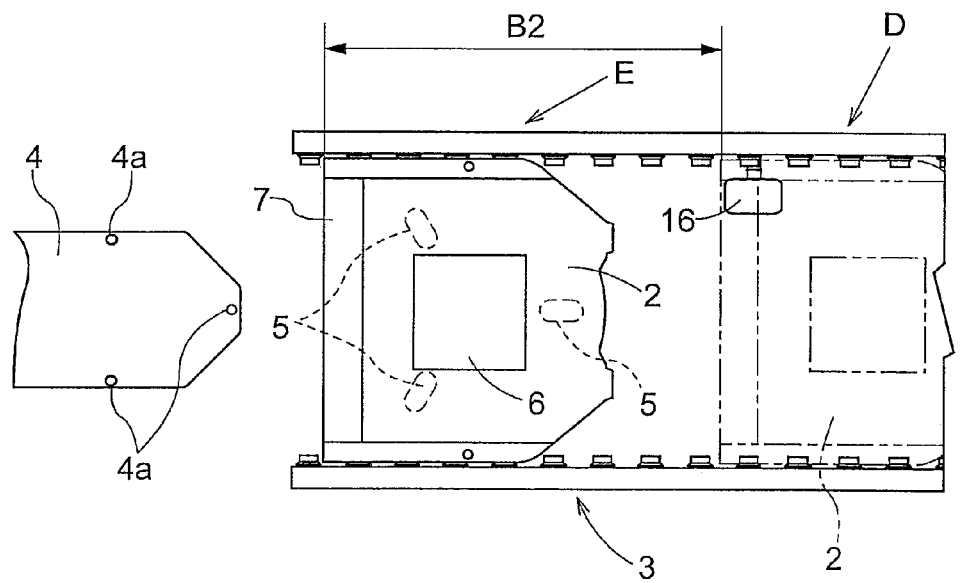
FIG. 4B is a plan view showing an article at a stop preparation position and a stop position.
Figure 5:
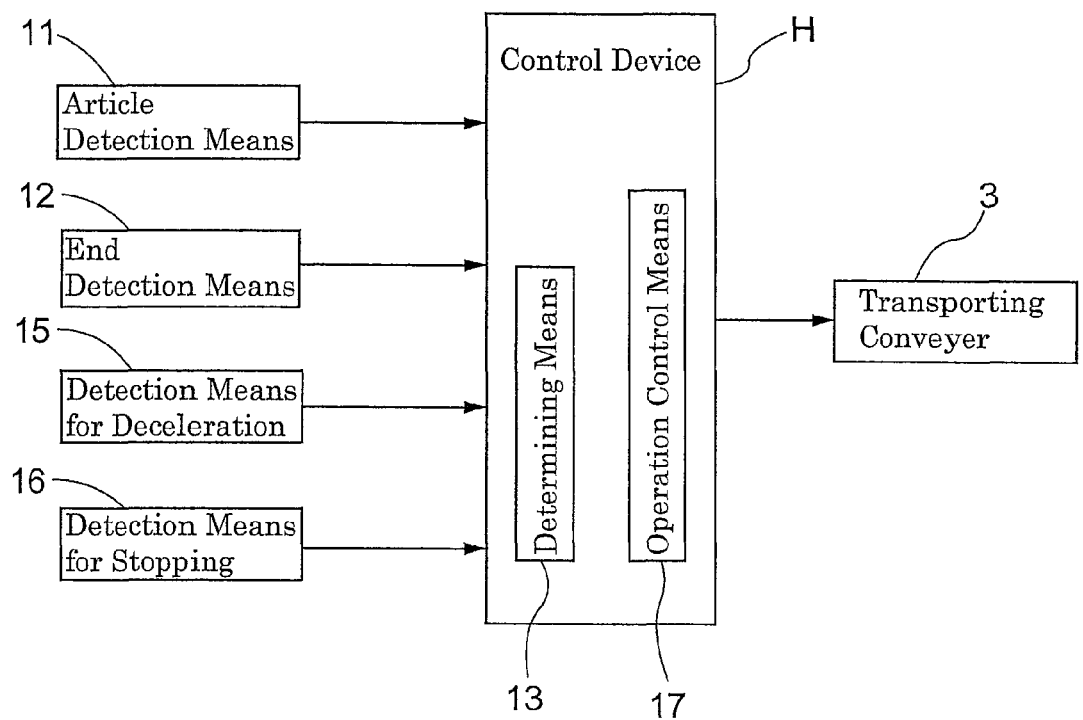
FIG. 5 is a control block diagram for the transport facility.

In addition, the transport facility includes detection means for deceleration 15 (see FIGS. 2 and 3) for detecting the forward end portion 7 of an article 1 or 2 located at a deceleration position C which is located upstream in the transporting direction with respect to the predetermined article position B, and stopping-purpose detection means 16 (see FIG. 4) for detecting the forward end portion 7 of an article 1 or 2 located at a stop preparation position D downstream in the transporting direction with respect to the predetermined article position B. As shown in FIG. 3, the detection means for deceleration 15 is a contact sensor and includes a main body portion, an arm pivotably provided to the main body portion, a horizontally extending shaft that is provided to the upper end of the arm, and a roller that can rotate about this shaft. When the roller contacts the forward end portion 7 of the article, the arm is pivoted; thus, the forward end portion 7 of the article is detected. In FIG. 3, the non-detected state, where the arm extends vertically, is shown with the solid lines, and the detected state, where the arm is tilted, is shown with the dotted lines. The stopping-purpose detection means 16 also has the same structure. The control device H is provided with operation control means 17 for controlling the operations of the transporting conveyor 3 based on the detected information from the detection means for deceleration 15 and from the stopping-purpose detection means 16. Incidentally, because the location of the predetermined article position B is set with respect to the positioning portions 5 of the articles 1 and 2, the positioning portions 5 are located at the same positions in the transporting direction for both FOUPs 1 and FOSBs 2 located at the predetermined article position B. However, because the locations of the stop preparation position D and the stop position E are set with respect to the forward end portion 7 of the articles 1 and 2, the positioning portions 5 of a FOUP 1 located at the stop preparation position D or the stop position E are displaced in the transporting direction from the corresponding positioning portions 5 of a FOSB 2 located at the stop preparation position D or the stop position E. In FIG. 4, the articles 1 and 2 located at the stop position E are shown with solid lines while the articles 1 and 2 located at the stop preparation position D described later are shown with phantom lines.

As an article 1 or 2 is detected by the detection means for deceleration 15, the operation control means 17 lowers the transporting speed of the transporting conveyor 3 from an article transporting speed to an article determination speed which is slower than the article transporting speed. Then, after the article 1 or 2 is transported by a set travel distance for deceleration from the location where the article 1 or 2 is detected by the detection means for deceleration 15, the operation control means 17 controls the operation of the transporting conveyor 3 based on the detected information from the detection means for deceleration 15 to increase the transporting speed of the transporting conveyor 3 to the article transporting speed. In addition, the set travel distance for deceleration is set to be greater than the distance from the positioning portions 5 of the article 1 or 2 located at the deceleration position C to the positioning portions 5 located at the held portion set position A.

That is, as shown in FIGS. 2 and 3, when an article 1 or 2 is detected by the detection means for deceleration 15 after the article 1 or 2 is transported to the deceleration position C, the transporting speed of the transporting conveyor 3 is lowered to the article determination speed from the article transporting speed. After the forward end portion 7 of the article 1 or 2 is detected by the end detection means 12 after the article 1 or 2 is transported to the predetermined article position B, the transporting speed of the transporting conveyor 3 is increased to the article transporting speed from the article determination speed. Thus, the facility is configured such that the end detection means 12 detects the forward end portion 7 of the article 1 or 2 when the transporting speed of the transporting conveyor 3 is low.

In addition, the operation control means 17 controls the operation of the transporting conveyor 3 based on the determination information from the determining means 13 and on the detected information from the stopping-purpose detection means 16 to transport the article 1 or 2 detected by the stopping-purpose detection means 16 by a set travel distance depending on the kind of the article 1 or 2.

That is, as shown in FIG. 4, the travel distance P2 for FOUPs is set as the set travel distance for FOUPs 1, and the travel distance B2 for FOSBs is set as the set travel distance for FOSBs 2. When an article 1 or 2 is detected by the stopping-purpose detection means 16 after an article 1 or 2 is transported to the stop preparation position D, if the detected the article 1 or 2 is a FOUP 1, then it is transported by the travel distance P2 for FOUPs from the stop preparation position D before the operation of the transporting conveyor 3 is stopped. And if the detected the article 1 or 2 is a FOSB 2, then it is transported by the travel distance B2 for FOSBs from the stop preparation position D before stopping the operation of the transporting conveyor 3.

And the travel distance B2 for FOSBs is greater than the travel distance B2 for FOUPs by the same distance that the length B1 from the positioning portions 5 to the forward end portion 7 in the FOSBs 2 is greater than the length P1 from the positioning portions 5 to the forward end portion 7 in the FOUPs 1 so that the positioning portions 5 of a stopped FOUP 1 and the positioning portions 5 of a stopped FOSB 2 stop at the same locations in the transporting direction.

In short, the plurality of kinds of articles 1 and 2 consisting of FOUPs 1 and FOSBs 2 are supported and transported horizontally along the transporting direction in the transporting attitude by the transporting conveyor 3 such that they pass through the predetermined article position B, the deceleration position C located upstream in the transporting direction with respect to the predetermined article position B, the stop preparation position D located downstream in the transporting direction with respect to the predetermined article position B, and the stop position E.

And when the article 1 or 2 is transported to the deceleration position C, the transporting speed of the transporting conveyor 3 is lowered, and the article 1 or 2 is detected by the article detection means 11 at the predetermined article position B, and the forward end portion 7 of the article 1 or 2 is detected by the end detection means 12. And the determining means 13 determines whether the kind of article 1 or 2 is a FOUP 1 or a FOSB 2 based on the detected information from the article detection means 11 and the detected information from the end detection means 12. Thereafter, after the article 1 or 2 is transported to the stop preparation position D, the article 1 or 2 is transported by the set distance for FOUPs or by the set distance for FOSBs depending on the kind of the article determined by the determining means 13 and is stopped at the stop position E. The article 1 or 2 thus stopped at the stop position E is scooped or picked up by the fork mechanism 4 and is transferred to a transfer location (not shown).

Alternative Embodiments (1) In the embodiment described above, the end detection means 12 is configured to detect whether the forward end portion 7 of the article located at the predetermined article position B is located downstream in the transporting direction with respect to the forward end portion 7 of a first article (FOUP 1) located at the predetermined article position B. And the determining means 13 is configured to determine, based on the detected information from the article detection means 11 and the detected information from the end detection means 12, that the article is a first article (i.e. a FOUP 1) when the forward end portion 7 of the article located at the predetermined article position B is not detected by the end detection means 12, and to determine that the article is a second article (i.e. a FOSB 2) when the forward end portion 7 of the article located at the predetermined article position B is detected by the end detection means 12. However, the configurations of the end detection means 12 and the determining means 13 may be changed suitably.

More specifically, for example, the end detection means 12 may include two or more pairs of light emitters and receivers that are arranged in the transporting direction. And the determining means 13 may be configured to determine the kind of an article based on whether the lights are received between the two or more pairs of the light emitters and light receivers. And, the end detection means 12 may be configured to detect the forward end portion 7 of an article after it has been transported from the predetermined article position B to a location downstream in the transporting direction. And the determining means 13 may be configured to determine the kind of the article based on the amount of time that has passed since the article located at the predetermined article position B was detected by the article detection means 11 until the forward end portion 7 of the article is detected by the end detection means 12. Incidentally, the kind of the three or more kinds of articles may be determined by configuring the end detection means 12 and the determining means 13 in this manner.

And a sensor that detects the forward end portion 7 by contacting the forward end portion 7 or some other member of the article, or any other sensor of the conventional art may be used as the end detection means 12 in place of the light emitter and the light receiver. Also, the detection means for deceleration 15 and/or stopping-purpose detection means 16 may be configured to include an optical sensor having a light emitter and a light receiver as opposed to a contact sensor.

(2) In the embodiment described above, the transport device is configured to be a transporting conveyor 3, and to transport different kinds of articles horizontally along the transporting direction by this transporting conveyor 3. However, the transport device may be configured to include a ceiling transport vehicle, and to transport different kinds of articles horizontally along the transporting direction and vertically by the ceiling transport vehicle. In addition, in the embodiment described above, the transport device is configured to be a transporting conveyor 3, and to transport articles with this transporting conveyor 3 such that their forward ends 7 face downstream. However, the transporting conveyor 3 may transport the articles such that their forward ends 7 face upstream.

(3) In the embodiment described above, the holding means is configured to be a fork mechanism 4, and the held portion is the positioning portions 5 for engaging the engaging pins 4a provided to this fork mechanism 4 and for positioning the article in the predetermined position. However, the holding means may be configured to be a ceiling transport vehicle and the held portion may be a flange portion 6 which is gripped by a grip device provided to the ceiling transport vehicle for positioning the article in the predetermined position.

(4) In the embodiment described above, holes formed in advance in the transported containers, such as FOUPs 1 or FOSBs 2, for storing two or more substrates are used as through holes 8 for allowing the detection light of the article detection means 11 to pass. However, additional through holes 8 for allowing the detection light of the article detection means 11 to pass may be formed in addition to these holes formed in advance. Also, the configuration of the article detection means 11 may be changed suitably. For example, the configuration may include one in which the held portion is detected directly, or in which a reflecting plate attached to the article such as a FOUP 1 or a FOSB 2 is detected, instead of detecting the through hole 8 through which detection light passes as described above. For example, a protruding portion etc. may be provided to an article at a position corresponding to through holes 8. This would allow a contact sensor that detects by contacting this protruding portion to be used as article detection means 11.

(5) In the embodiment described above, the operation of the transport device is controlled based on the determination information from the determining means 13 to transport articles by a predetermined travel distance depending on the kind of the article. However, the operation of the transport device may be controlled based on the determination information from the determining means 13 to transport the articles to predetermined destinations depending on the kind of the article. That is, for example, the transporting conveyor 3 as the transport device may include a mixed-load conveyor for supporting and transporting both FOUPs 1 and FOSBs 2, a FOUPs-only conveyor (i.e. an exclusive conveyer) for supporting and transporting only FOUPs 1, a FOSBs-only conveyor (exclusive conveyer) for supporting and transporting only FOSBs 2, and branching conveyors provided between the mixed-load conveyer and the exclusive conveyors. And the operation of the branching conveyer may be controlled based on the determination information from the determining means 13 to transport an article 1 or 2 to the FOUPs-only conveyer if the article transported to a branching conveyer from the mixed-load conveyer is determined to be a FOUP 1 by the determining means 13, and to transport the article 1 or 2 to the FOSBs-only conveyer if the article transported to a branching conveyer from the mixed-load conveyer is determined to be a FOSB 2 by the determining means 13.

(6) When FOUPs 1 and FOSBs 2 are transported as the different kinds of articles, the transport device may transport different types of FOSBs 2 whose lengths from the held portion to one end portion in the fore and aft direction are different depending on the type, as FOSBs 2 whose lengths from the held portion to one end portion in the fore and aft direction are longer that of the FOUPs 1. In this case, the different types of the FOSBs may be transported as the same kind of articles, or the different types of the FOSBs may be transported as different kinds of articles. Also, while FOSBs 2 having a flange portion 6 are transported by the transport device in the embodiment described above, FOSBs 2 without a flange portion 6 may be transported by the transport device. And both the FOSBs 2 having a flange portion 6 and the FOSBs 2 without a flange portion 6 may be transported by the transport device.

What is claimed is:

1. A transport facility including a transport device configured to transport an article having a held portion to be held by holding member, along a transporting path with the article in a transporting attitude in which the held portion is located in a central part of the article in a fore and aft direction, the transport device being configured to transport different kinds of articles having different lengths from the held portion to one end portion along the fore and aft direction with the article in the transporting attitude, the transport facility comprising:
    article detection member for detecting an article located at a predetermined article position with the held portion being located at a held portion set position that is set in advance;
    end detection member for detecting one end portion, along the fore and aft direction, of the article detected by the article detection member; and
    determining member for determining a kind of the article based on detected information from the article detection member and on detected information from the end detection member.

2. The transport facility as defined in claim 1, wherein
the transport device is configured to transport, as the different kinds of articles, a FOUP that stores two or more substrates and that is transported within a factory, and a FOSB that stores two or more substrates and that is transported between factories, wherein
provided to an undersurface of each of the different kinds of articles as the held portion are positioning portions that engage engaging pins provided to the holding member, when the article is received and held by the holding member, for positioning the article in the predetermined position, and wherein
a length from the one end portion, in the fore and aft direction, of the FOSB to the positioning portions is set to be longer than a length from the one end portion, in the fore and aft direction, of the FOUP to the positioning portions.

3. The transport facility as defined in claim 1, wherein
a through hole that extends through the article in a vertical direction is formed in each of the different kinds of articles such that a location of the through hole corresponds to the held portion, and wherein
the article detection member is configured to detect the article whose positioning portion is located at the held portion set position by virtue of the fact that a light receiver receives a detection light emitted by a light emitter through the through hole.

4. The transport facility as defined in claim 1, wherein
the transport device includes a transporting conveyor that supports and transports the different kinds of articles horizontally along the transporting path by way of the predetermined article position and a stop preparation position located downstream in the transport direction with respect to the predetermined article position, wherein
the transport facility further comprises:
stopping-purpose detection member for detecting one end portion along the transporting direction which is one end portion along the fore and aft direction of the article transported to the stop preparation position, and
operation control member for controlling operations of the transporting conveyor based on the determination information from the determining member and on the detected information from the stopping-purpose detection member so as to transport the article detected by the stopping-purpose detection member by a set travel distance that is set in advance depending on the kind of the article.

5. The transport facility as defined in claim 1, wherein
the end detection member is configured to detect a position of the one end portion, along the fore and aft direction, of the article located at the predetermined article position, and wherein
the determining member is configured to determine the kind of the article based on the detected information from the article detection member and on the detected information from the end detection member in order to determine the kind of the article based on the position of the one end portion, along the fore and aft direction, of the article located at the predetermined article position.

6. The transport facility as defined in claim 5, wherein
the transport device is configured to transport, as the different kinds of articles, a first article, and a second article whose length from the held portion to the one end portion along the fore and aft direction in the transporting attitude is greater than a length from the held portion to the one end portion of the first article in the transporting attitude in the fore and aft direction, wherein
the end detection member is configured to detect whether one end portion, along the fore and aft direction, of the detected article at the predetermined article position exists to one side in the fore and aft direction with respect to the one end portion, along the fore and aft direction, of the first article at the predetermined article position, and wherein
the determining member is configured to determine, based on the detected information from the article detection member and on the detected information from the end detection member, that the detected article is the first article when the one end portion, along the fore and aft direction, of the detected article located at the predetermined article position is not detected by the end detection member, and that the detected article is the second article when the one end portion, along the fore and aft direction, of the detected article located at the predetermined article position is detected by the end detection member.

7. A transport facility having a transport device for transporting along a transporting path different kinds of articles each having a held portion to be held by a holding member, the transport facility comprising:
an article sensor that detects a first structure provided at a location that corresponds to a reference position set with respect to the held portion of an article;
an end sensor that detects one end portion, along a fore and aft direction, of the article whose first structure is detected by the article sensor; and
a controller that determines a kind of the article by obtaining a distance between the one end portion and a specific position set with respect to the held portion based on detected information from the article sensor and on detected information from the end sensor.

8. The transport facility as defined in claim 7, wherein
the different kinds of articles includes a first article, and a second article whose distance from the specific position set with respect to the held portion to the one end portion along the fore and aft direction is greater than a distance from the specific position set with respect to the held portion of the first article to the one end portion along the fore and aft direction, wherein
the end sensor is configured to detect whether one end portion, along the fore and aft direction, of the article detected by the article sensor exists to one side in the fore and aft direction with respect to the one end portion, along the fore and aft direction, of the first article when the first structure of the detected article is detected by the article sensor, and wherein
the controller is configured to determine, based on the detected information from the article detection sensor and on the detected information from the end sensor, that the detected article is the first article when the one end portion, along the fore and aft direction, of the detected article is not detected by the end sensor when the first structure of the detected article is detected by the article sensor, and that the detected article is the second article when the one end portion, along the fore and aft direction, of the detected article is detected by the end sensor when the first structure of the detected article is detected by the article sensor.

9. The transport facility as defined in claim 7, wherein
the different kinds of articles include a FOUP and a FOSB, wherein
the held portion includes positioning portions provided in an undersurface of the article for positioning the article in the predetermined position by engaging engaging pins provided to the holding member, and wherein
a distance in the FOSB from the one end portion along the fore and aft direction to the specific position set with respect to the positioning portions is set to be greater than a distance in the FOUP from the one end portion along the fore and aft direction to the specific position set with respect to the positioning portions.

10. The transport facility as defined in claim 7, wherein
the first structure is a through hole which extends through the article in a vertical direction, and wherein
the article sensor is configured to detect that the first structure provided at the location that corresponds to the reference position of the article reached a position of the article sensor by virtue of the fact that a light receiver receives a detection light emitted by a light emitter through the through hole.

11. The transport facility as defined in claim 7, wherein
the transport device is a transporting conveyor that extends by way of a stop preparation position located downstream in the transporting direction with respect to a position of the article sensor, wherein
the transport facility further comprises:
a second end sensor that detects one end portion, along the fore and aft direction, of the article transported to the stop preparation position, and
a conveyor controller that controls operations of the transporting conveyor based on determination information from the controller and on detected information from the second end sensor so as to transport the article detected by the second end sensor by a set travel distance that is set in advance depending on the kind of the article.

* * * * *